(12) United States Patent
Sumitomo

(10) Patent No.: US 10,720,518 B2
(45) Date of Patent: Jul. 21, 2020

(54) SEMICONDUCTOR DEVICE

(71) Applicant: DENSO CORPORATION, Kariya, Aichi-pref. (JP)

(72) Inventor: Masakiyo Sumitomo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/351,755

(22) Filed: Mar. 13, 2019

(65) Prior Publication Data

US 2019/0214491 A1 Jul. 11, 2019

Related U.S. Application Data

(63) Continuation of application No. PCT/JP2017/040490, filed on Nov. 9, 2017.

(30) Foreign Application Priority Data

Nov. 15, 2016 (JP) .................................. 2016-222540

(51) Int. Cl.
*H01L 29/732* (2006.01)
*H01L 29/739* (2006.01)
(Continued)

(52) U.S. Cl.
CPC ...... *H01L 29/7397* (2013.01); *H01L 29/0804* (2013.01); *H01L 29/0821* (2013.01);
(Continued)

(58) Field of Classification Search
CPC .......... H01L 21/8224; H01L 21/82285; H01L 27/0652–0664; H01L 27/0716;
(Continued)

(56) References Cited

U.S. PATENT DOCUMENTS

2004/0041171 A1 3/2004 Ogura et al.
2005/0179083 A1 8/2005 Ogura et al.
(Continued)

FOREIGN PATENT DOCUMENTS

| JP | 2006-245477 A | 9/2006 |
|---|---|---|
| JP | 2014-099449 A | 5/2014 |
| JP | 2016-46416 A | 4/2016 |

*Primary Examiner* — Shaun M Campbell
*Assistant Examiner* — Suberr L Chi
(74) *Attorney, Agent, or Firm* — Posz Law Group, PLC

(57) ABSTRACT

A semiconductor device includes a drift layer, a base layer, a collector layer, gate insulating films, gate electrodes, an emitter region, a first electrode and a second electrode. The base layer is provided on the drift layer. The drift layer is provided between the base layer and the collector layer. The gate insulating films are respectively provided on wall surfaces of trenches penetrating the base layer to reach the drift layer. The gate electrodes are respectively provided on the gate insulating films. The emitter region is provided in a surface layer portion of the base layer, and is in contact with the trenches. The first electrode is electrically coupled with the base layer and the emitter region. The second electrode is electrically coupled with the collector layer. Some gate electrodes are applied with a gate voltage. Other gate electrodes are electrically coupled to the first electrode.

3 Claims, 14 Drawing Sheets

(51) Int. Cl.
  *H01L 29/08* (2006.01)
  *H01L 29/417* (2006.01)
  *H01L 29/423* (2006.01)
  *H01L 29/10* (2006.01)
  *H01L 29/40* (2006.01)

(52) U.S. Cl.
  CPC ...... *H01L 29/1004* (2013.01); *H01L 29/1095* (2013.01); *H01L 29/407* (2013.01); *H01L 29/41708* (2013.01); *H01L 29/4236* (2013.01); *H01L 29/42376* (2013.01); *H01L 29/739* (2013.01)

(58) Field of Classification Search
  CPC ... H01L 27/0755–0777; H01L 27/0821; H01L 27/0823–0828; H01L 29/66333–66348; H01L 27/732–7327; H01L 27/7371–7378; H01L 27/7395–7398
  See application file for complete search history.

(56) References Cited

U.S. PATENT DOCUMENTS

| | | | |
|---|---|---|---|
| 2007/0278566 A1 | 12/2007 | Ogura et al. | |
| 2015/0179636 A1* | 6/2015 | Pfirsch | H01L 29/7397 257/140 |
| 2016/0141400 A1* | 5/2016 | Takahashi | H01L 29/7397 257/140 |
| 2016/0181408 A1* | 6/2016 | Aichinger | H01L 21/823462 257/77 |

* cited by examiner

SEMICONDUCTOR DEVICE

CROSS REFERENCE TO RELATED APPLICATIONS

The present application is a continuation application of International Patent Application No. PCT/JP2017/040490 filed on Nov. 9, 2017, which designated the U.S. and claims the benefit of priority from Japanese Patent Application No. 2016-222540 filed on Nov. 15, 2016. The entire disclosures of all of the above applications are incorporated herein by reference.

TECHNICAL FIELD

The present disclosure relates to a semiconductor device.

BACKGROUND

A semiconductor device in which trench gate type, insulated gate type bipolar transistor (hereinafter simply referred to as IGBT) elements are formed may be used as a switching element in an inverter, for example.

SUMMARY

The present disclosure provides a semiconductor device including a drift layer, a base layer, a collector layer, gate insulating films, gate electrodes, an emitter region, a first electrode and a second electrode. The base layer is provided on the drift layer. The drift layer is provided between the base layer and the collector layer. The gate insulating films are respectively provided on wall surfaces of trenches penetrating the base layer to reach the drift layer. The gate electrodes are respectively provided on the gate insulating films. The emitter region is provided in a surface layer portion of the base layer, and is in contact with the trenches. The first electrode is electrically coupled with the base layer and the emitter region. The second electrode is electrically coupled with the collector layer. Some gate electrodes are applied with a gate voltage. Other gate electrodes are electrically coupled to the first electrode.

BRIEF DESCRIPTION OF THE DRAWINGS

The above and other objects, features and advantages of the present disclosure will become more apparent from the following detailed description made with reference to the accompanying drawings in which.

DETAILED DESCRIPTION

Figure 1:
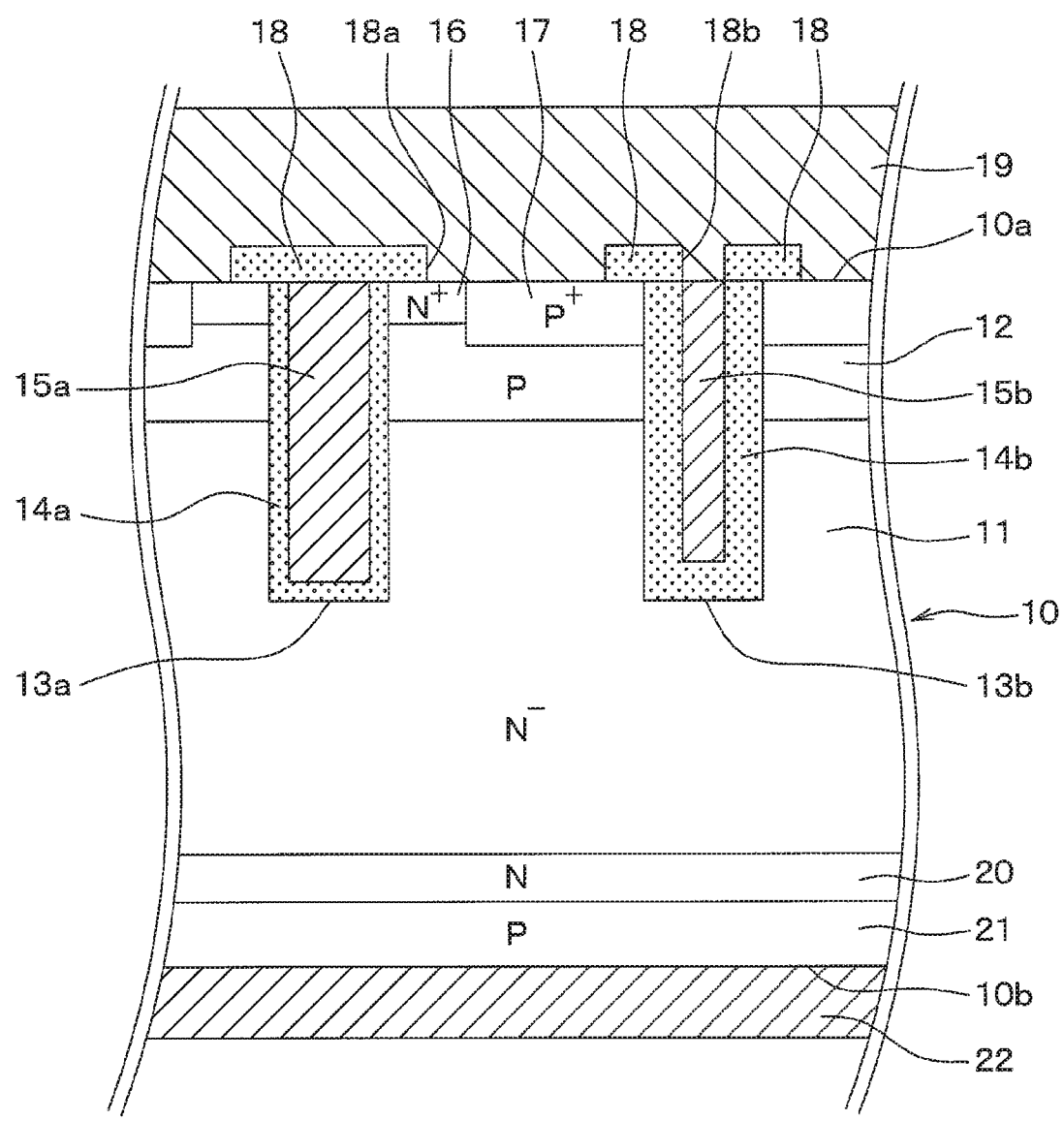
FIG. 1 is a cross-sectional view of a semiconductor device according to a first embodiment.

For example, a semiconductor device in which IGBT elements are formed has a drift layer having an $N^-$-type. A base layer having a P-type is formed on the drift layer. A plurality of trenches is formed to pass through the base layer. In the trenches, gate insulating films are respectively formed to cover wall surfaces of the trenches. Gate electrodes are respectively formed on the gate insulating films. Further, in a surface layer portion of the base layer, emitter regions that are an $N^+$-type are formed to be in contact with side surfaces of the trenches.

A collector layer having the P-type is formed on the side opposite to the base layer with respect to the drift layer. An upper electrode electrically coupled to the base layer and the emitter regions is formed. A lower electrode electrically coupled to the collector layer is formed.

To reduce a conduction loss in the semiconductor device described above, some of a plurality of the gate electrodes may be coupled to the upper electrode to make the some of the plurality of gate electrodes identical in potential to the upper electrode. That is, the some of the plurality of gate electrodes may serve as dummy gate electrodes.

However, according to the detailed investigations by the present inventors on the semiconductor device described above, some of the gate electrodes coupled to the upper electrode is likely to increase a switching loss during a transition from an off state where no current flows to an on state where a current is allowed to flow.

Embodiments of the present disclosure will now be described herein with reference to the drawings. For purpose of description, same reference numerals designate identical or corresponding components throughout the embodiments described below.

First Embodiment

A first embodiment will be described herein. A semiconductor device according to the present embodiment may be preferably used as a power switching element in a power supply circuit such as an inverter or a direct current (DC)/direct current (DC) converter, for example.

As illustrated in FIG. 1, the semiconductor device includes a semiconductor substrate 10 that is an $N^-$-type and functions as a drift layer 11. A base layer 12 that is a P-type is formed on the drift layer 11 (i.e., adjacent to a surface 10a of the semiconductor substrate 10).

In the semiconductor substrate 10, pluralities of trenches 13a and 13b passing through the base layer 12 and reaching the drift layer 11 are formed. The base layer 12 is thus divided by the pluralities of trenches 13a and 13b. In the present embodiment, the pluralities of trenches 13a and 13b are formed in a stripe shape at equal intervals in a direction among surface directions of the surface 10a of the semiconductor substrate 10 (i.e., in a sheet depth direction in FIG. 1). Herein, the trenches 13a will be described as the first trenches 13a, whereas the trenches 13b will be described as the second trenches 13b.

The first trenches 13a are respectively embedded together with first gate insulating films 14a respectively formed to cover wall surfaces of the first trenches 13a, and first gate electrodes 15a respectively formed on the first gate insulating films 14a. Similarly, the second trenches 13b are respectively embedded together with second gate insulating films 14b respectively formed to cover wall surfaces of the second trenches 13b, and second gate electrodes 15b respectively formed on the second gate insulating films 14b.

In the present embodiment, the first gate insulating films 14a and the second gate insulating films 14b are respectively made of silicon oxide films ($SiO_2$), for example, whereas the first gate electrodes 15a and the second gate electrodes 15b are made of polysilicon, for example. In the present embodiment, the first trenches 13a and the second trenches 13b are alternately formed in a direction orthogonal to an extending direction of each of the first trenches 13a and the second trenches 13b, that is, a direction along a surface direction of the semiconductor substrate 10 (i.e., a sheet left-right direction in FIG. 1). However, some of a plurality of the first trenches 13a and some of a plurality of the second trenches 13b may be alternately formed in the direction orthogonal to the extending direction of each of the first trenches 13a and the second trenches 13b, that is, the direction along the surface direction of the semiconductor substrate 10, for example. An order of arrangement may be changed as required.

Configurations of the first gate insulating films 14a and the second gate insulating films 14b according to the present embodiment will be described herein.

The first gate insulating films 14a each have an almost even thickness per portion respectively on the wall surfaces of the first trenches 13a. Specifically, as will be described later, the first gate electrodes 15a are coupled with an external gate circuit, and a predetermined gate voltage from the gate circuit is applied thereto so that an inversion layer (i.e., channel region) is formed in each of portions, which abut on the first trenches 13a, of the base layer 12. That is, a thickness of each of portions, which abut on the base layer 12, of the first gate insulating films 14a is specified to a thickness allowing an inversion layer to be formed. In other words, the thickness of each of the portions, which abut on the base layer 12, of the first gate insulating films 14a is specified by a thickness of a portion determining a threshold voltage Vth for a MOS gate. A thickness of each of other portions of the first gate insulating films 14a is also made identical to the thickness of each of the portions, which abut on the base layer 12, of the first gate insulating films 14a.

The second gate insulating films 14b each have an almost even thickness per portion respectively on the wall surfaces of the second trenches 13b. However, the second gate insulating films 14b are respectively wholly made greater in thickness than the first gate insulating films 14a, and, in the present embodiment, each have a thickness twice the thickness of each of the first gate insulating films 14a.

A capacitance per unit area of each of the portions, which are respectively formed on the regions abutting on the drift layer 11 on the side surfaces of the second trenches 13b, of the second gate insulating films 14b is referred to as a second capacitance. A capacitance per unit area of each of the portions, which are respectively formed on the regions abutting on the base layer 12 on the side surfaces of the first trenches 13a, of the first gate insulating films 14a is referred to as a first capacitance.

At all of the portions, the second capacitance is equal to or lower than the first capacitance. In the present embodiment, since the thickness of each of the second gate insulating films 14b is wholly made greater than the thickness of each of the first gate insulating films 14a, the second capacitance is smaller than the first capacitance at all of the portions, In a surface layer portion of the base layer 12, emitter regions 16 that are an $N^+$-type and body regions 17 that are a $P^+$-type are formed. Specifically, the emitter regions 16 are each higher in impurity concentration than the drift layer 11, terminate within the base layer 12, and are formed to respectively abut on the side surfaces of the first trenches 13a. On the other hand, the body regions 17 are each higher in impurity concentration than the base layer 12, and are formed to terminate within the base layer 12, similarly to the emitter regions 16.

More specifically, the emitter regions 16 each have a structure respectively extending into a bar shape to abut on the side surfaces of the first trenches 13a in the extending direction of each of the first trenches 13a, and terminating inside from tips of the first trenches 13a. The body regions 17 each have a structure respectively extending into a bar shape to abut on the side surfaces of the second trenches 13b in the extending direction of each of the second trenches 13b, and terminating inside from tips of the second trenches 13b. The body regions 17 are respectively formed deeper than the emitter regions 16, based on the surface 10a of the semiconductor substrate 10.

On the surface 10a of the semiconductor substrate 10, an interlayer insulating film 18 made of borophosphosilicate glass (BPSG), for example, is formed. In the interlayer insulating film 18, first contact holes 18a that respectively allow parts of the emitter regions 16 and the body regions 17 to be exposed are formed, and second contact holes 18b that respectively allow the second gate electrodes 15b to be exposed are formed. On the interlayer insulating film 18, an upper electrode 19 electrically coupled with the emitter regions 16 and the body regions 17 via the first contact holes 18a, and also coupled with the second gate electrodes 15b via the second contact holes 18b is formed. That is, in the present embodiment, the second gate electrodes 15b are each identical in potential to the upper electrode 19, and function as dummy gate electrodes.

In the present embodiment, the first gate electrodes 15a correspond to some of the gate electrodes, the second gate electrodes 15b correspond to the others of the gate electrodes, and the upper electrode 19 corresponds to a first electrode. The first gate electrodes 15a are electrically coupled to the external gate circuit via gate wires and gate pads (not illustrated), for example, and the predetermined gate voltage is applied thereto from the gate circuit.

On an opposite surface to the surface adjacent to the base layer 12 (i.e., adjacent to the other surface 10b of the semiconductor substrate 10) of the drift layer 11, a field stop layer (hereinafter simply referred to as an FS layer) 20 that is an N-type is formed. The FS layer 20 is not necessarily required. However, the FS layer 20 is provided to prevent a depletion layer from expanding to improve a pressure-resistance capability and a capability of suppressing a steady loss, as well as to control an injection amount of holes to be injected from the other surface 10b of the semiconductor substrate 10.

On the side opposite to the drift layer 11 with respect to the FS layer 20, a collector layer 21 that is the P-type is formed. On the collector layer 21 (i.e., on the other surface 10b of the semiconductor substrate 10), a lower electrode 22 electrically coupled to the collector layer 21 is formed. In the present embodiment, the lower electrode corresponds to a second electrode.

The configuration of the semiconductor device according to the present embodiment has been described. In the present embodiment, the N$^+$-type and the N$^-$-type correspond to a first conductivity type, whereas the P-type and the P$^+$-type correspond to a second conductivity type.

Figure 2:
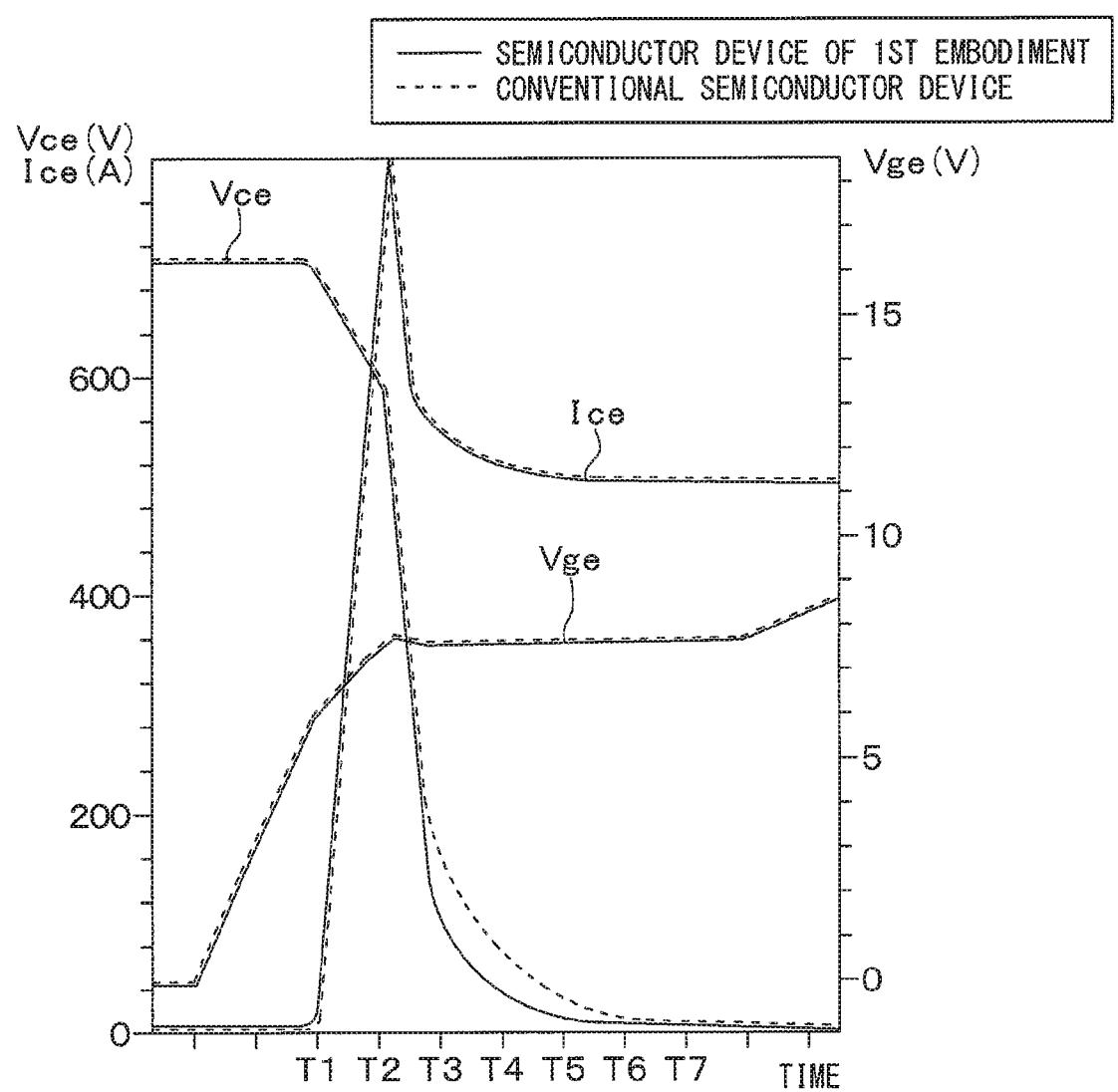
FIG. 2 is a timing chart illustrating a relationship among a gate-emitter voltage Vge, a collector-emitter current Ice, and a collector-emitter voltage Vce when the semiconductor device transitions from an off state to an on state.
Figure 3A:
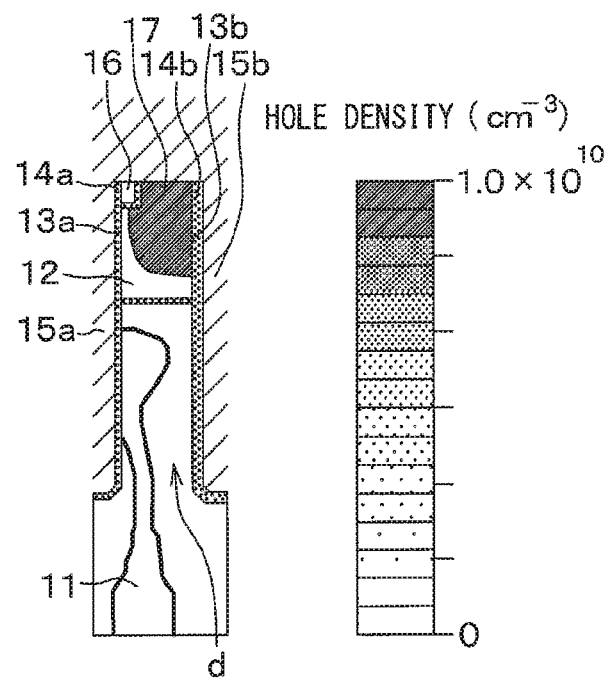
FIG. 3A is a result of simulation, illustrating a hole density at a point of time T1 in FIG. 2, in the semiconductor device illustrated in FIG. 1.
Figure 3B:
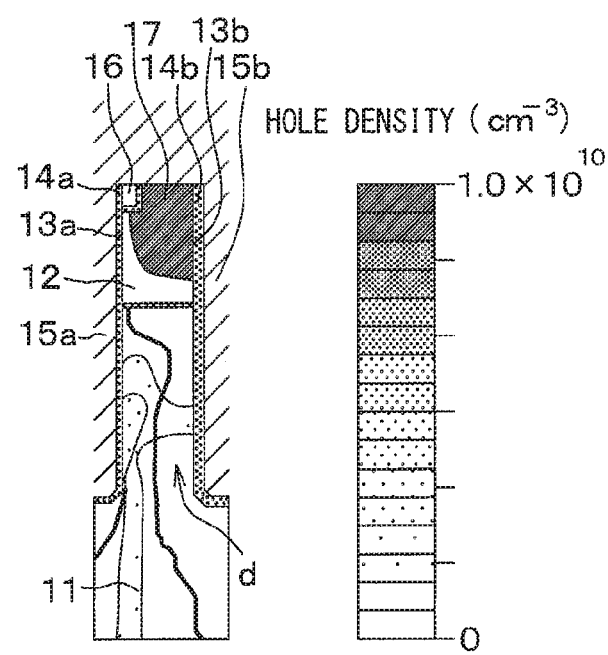
FIG. 3B is a result of simulation, illustrating a hole density at a point of time T2 in FIG. 2, in the semiconductor device illustrated in FIG. 1.
Figure 3C:
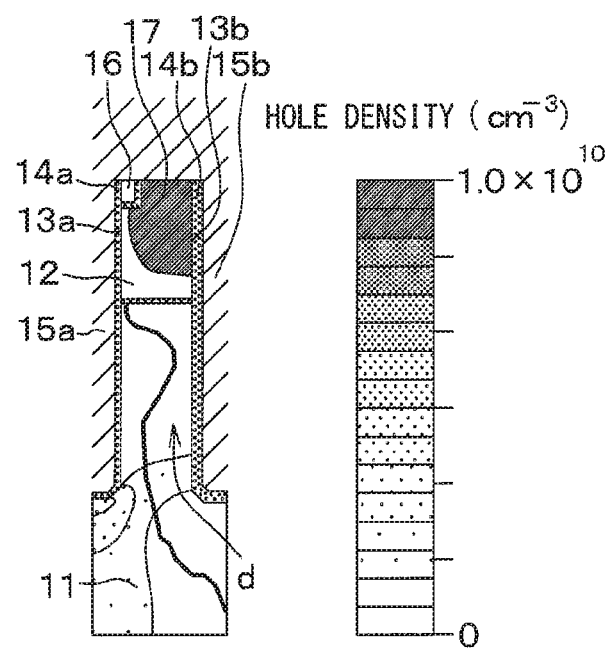
FIG. 3C is a result of simulation, illustrating a hole density at a point of time T3 in FIG. 2, in the semiconductor device illustrated in FIG. 1.
Figure 3D:
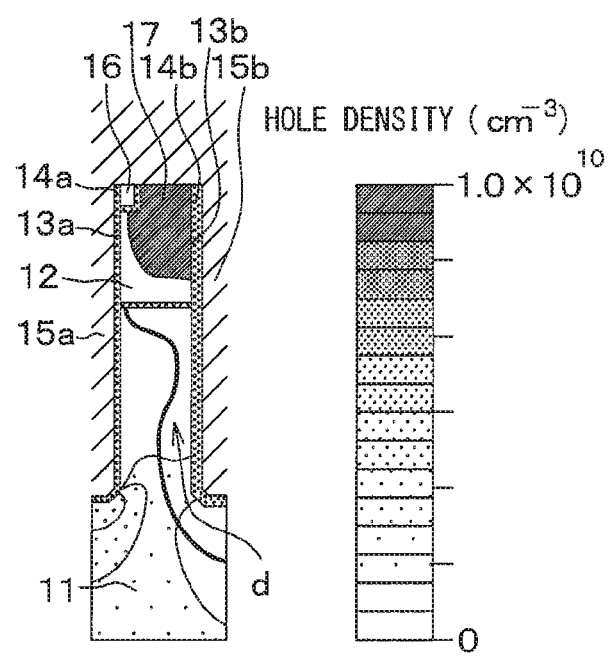
FIG. 3D is a result of simulation, illustrating a hole density at a point of time T4 in FIG. 2, in the semiconductor device illustrated in FIG. 1.
Figure 3E:
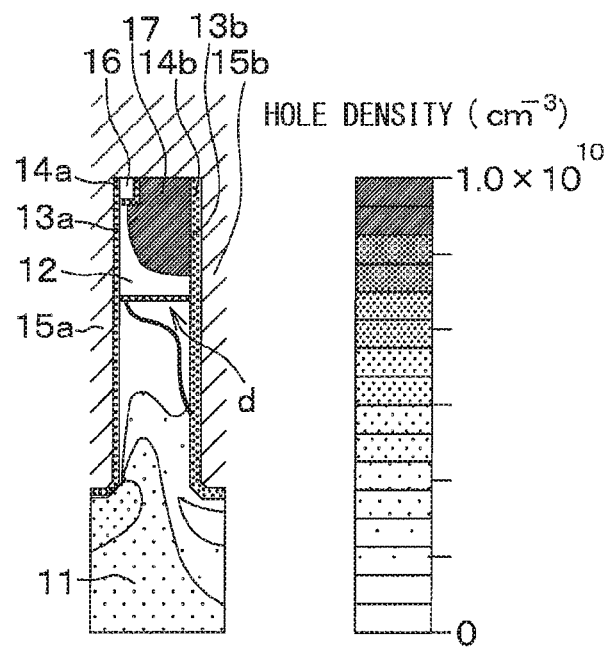
FIG. 3E is a result of simulation, illustrating a hole density at a point of time T5 in FIG. 2, in the semiconductor device illustrated in FIG. 1.
Figure 3F:
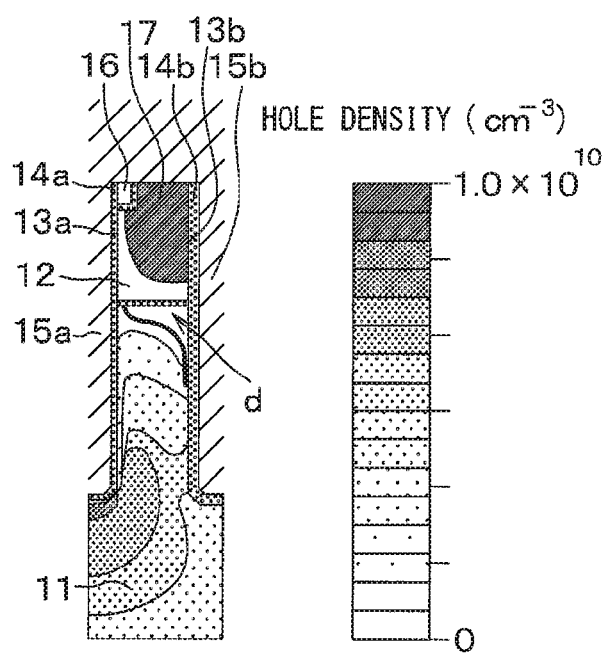
FIG. 3F is a result of simulation, illustrating a hole density at a point of time T6 in FIG. 2, in the semiconductor device illustrated in FIG. 1.
Figure 3G:
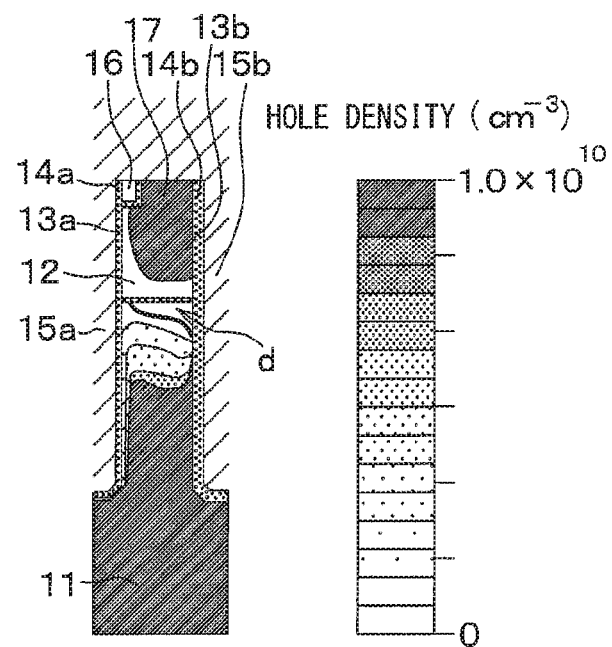
FIG. 3G is a result of simulation, illustrating a hole density at a point of time T7 in FIG. 2, in the semiconductor device illustrated in FIG. 1.
Figure 4A:
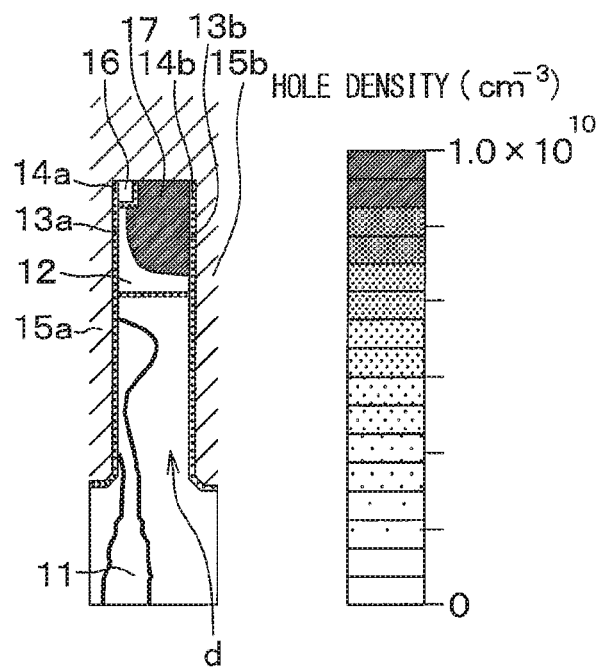
FIG. 4A is a result of simulation, illustrating a hole density at the point of time T1 in FIG. 2, in a conventional semiconductor device.
Figure 4B:
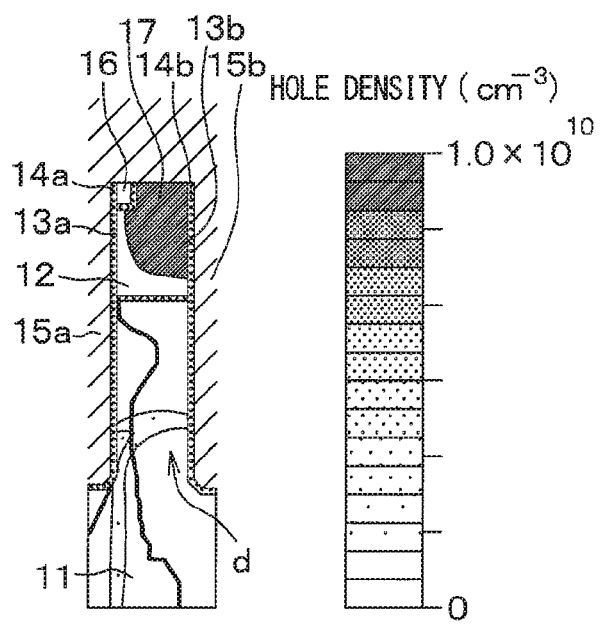
FIG. 4B is a result of simulation, illustrating a hole density at he point of time T2 in FIG. 2, in the conventional semiconductor device.
Figure 4C:
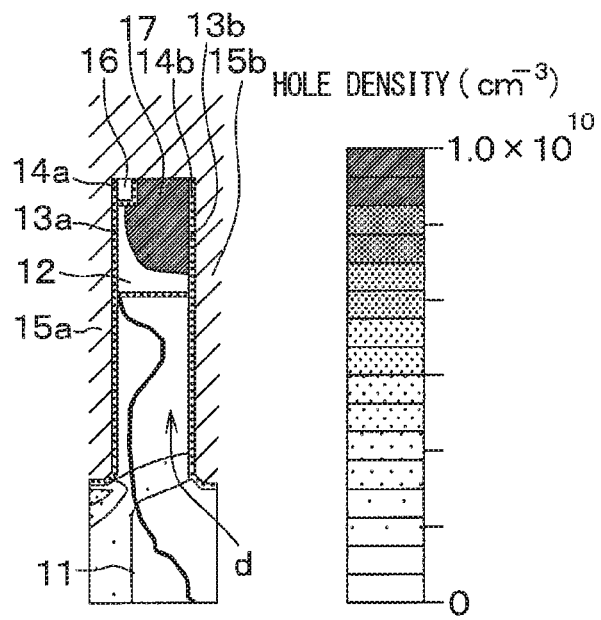
FIG. 4C is a result of simulation, illustrating a hole density at he point of e T3 in FIG. 2, in the conventional semiconductor device.
Figure 4D:
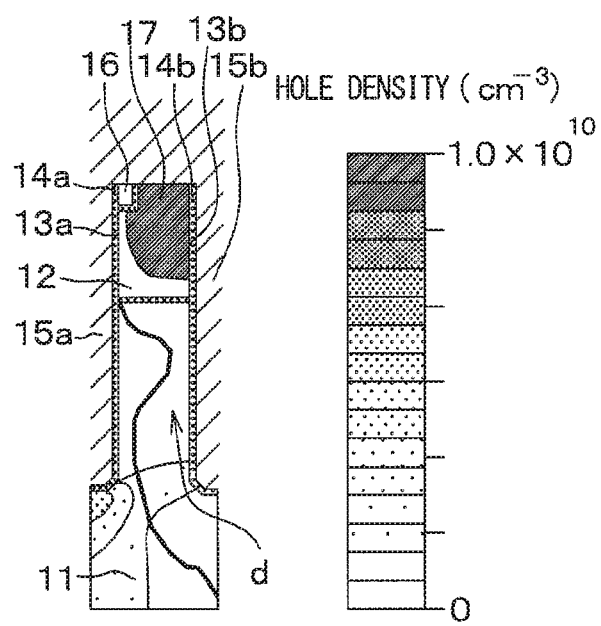
FIG. 4D is a result of simulation, illustrating a hole density at the point of time T4 in FIG. 2, in the conventional semiconductor device.
Figure 4E:
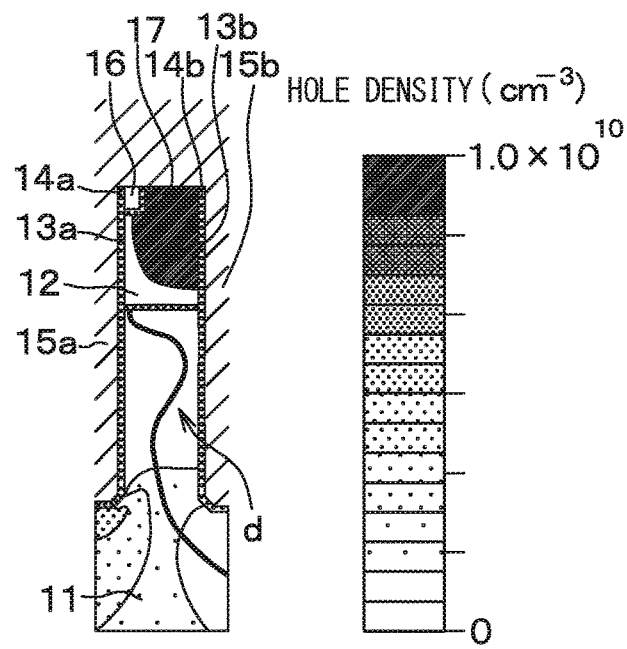
FIG. 4E is a result of simulation, illustrating a hole density at the point of time T5 in FIG. 2, in the conventional semiconductor device.
Figure 4F:
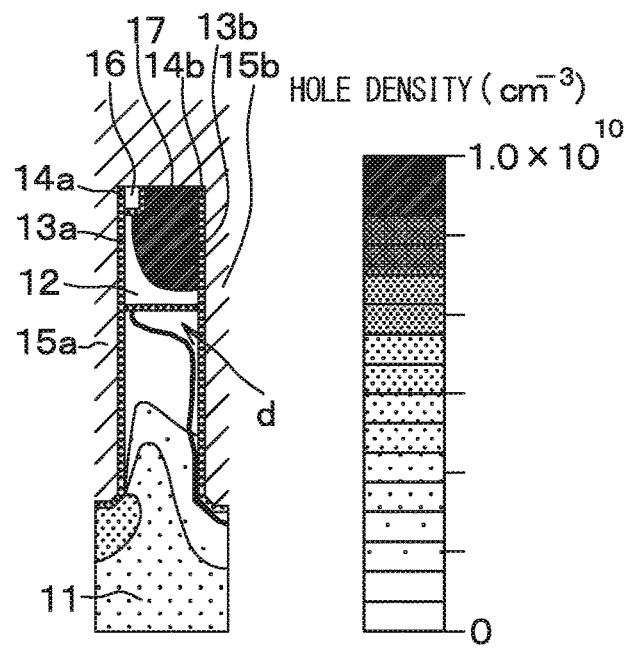
FIG. 4F is a result of simulation, illustrating a hole density at the point of time T6 in FIG. 2, in the conventional semiconductor device.
Figure 4G:
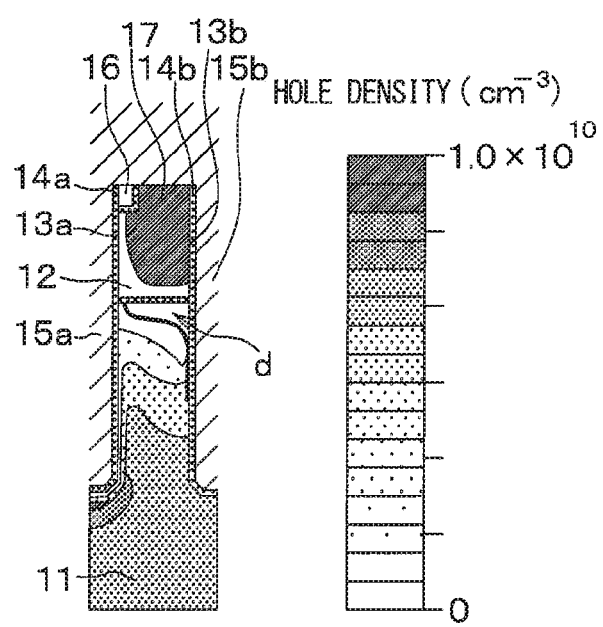
FIG. 4G is a result of simulation, illustrating a hole density at the point of time T7 in FIG. 2, in the conventional semiconductor device.
Figure 5:
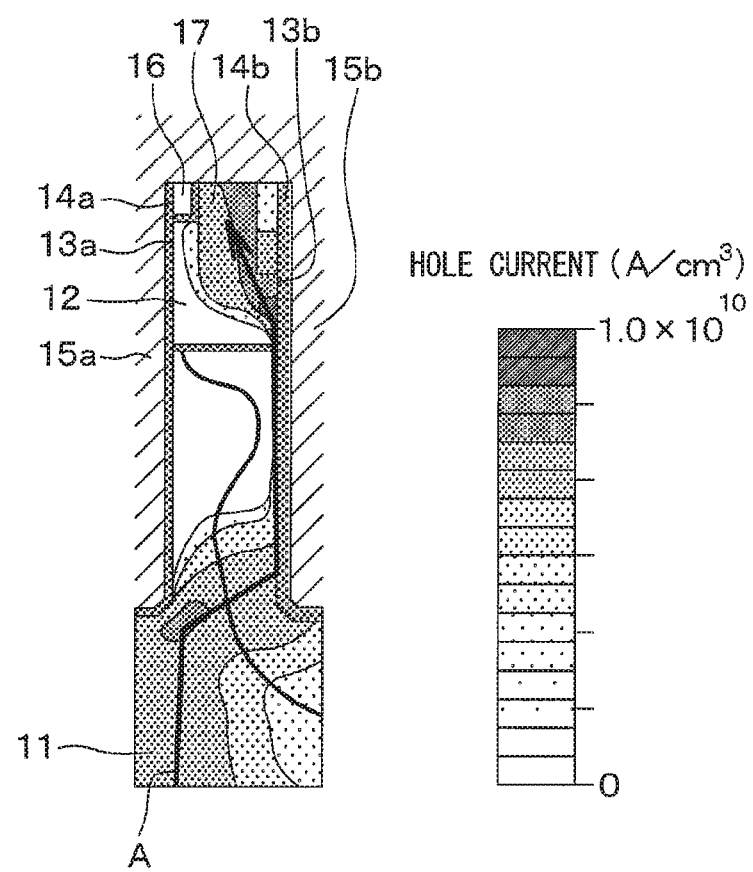
FIG. 5 is a result of simulation, illustrating a hole current, corresponding to FIG. 4E.

Next, how the semiconductor device described above transitions from an off state where no current flows to an on state where a current is allowed to flow will be described, A description will be given with reference to FIGS. 2 to 5 based on a comparison with a semiconductor device (hereinafter will be referred to as a conventional semiconductor device) where the second gate insulating films 14b are respectively made identical in thickness to the first gate insulating films 14a, and the second gate electrodes 15b are electrically coupled to the upper electrode 19. FIGS. 3A to 3F are results of simulation, illustrating hole densities at points of time in FIG. 2, in the semiconductor device according to the present embodiment. FIGS. 4A to 4F are results of simulation, illustrating hole densities at the points of time in FIG. 2, in the conventional semiconductor device. Specifically, FIGS. 3A and 4A illustrate the hole densities at a point of time T1, FIGS. 3B and 4B illustrate the hole densities at a point of time T2, FIGS. 3C and 4C illustrate the hole densities at a point of time T3, and FIGS. 3D and 4D illustrate the hole densities at a point of time T4. FIGS. 3E and 4E illustrate the hole densities at a point of time T5, FIGS. 3F and 4F illustrate the hole densities at a point of time T6, and FIGS. 3G and 4G illustrate the hole densities at a point of time T7.

When the semiconductor device described above transitions from the off state to the on state, while the upper electrode 19 is grounded and a positive voltage is applied to the lower electrode 22, the predetermined gate voltage is applied to the first gate electrodes 15a from the external gate circuit. Therefore, a gate-emitter voltage Vge gradually rises. After that, when a gate potential at each of the first gate electrodes 15a reaches and exceeds the threshold voltage Vth for the MOS gate at the point of time T1 in the semiconductor device, an inversion layer (i.e., channel region) is formed in the portion abutting on each of the first trenches 13a in the base layer 12. In the semiconductor device, electrons are supplied from each of the emitter regions 16, via the inversion layer, to the drift layer 11, and holes are supplied from the collector layer 21 to the drift layer 11. Therefore, in the semiconductor device, a resistance value in the drift layer 11 lowers due to conductivity modulation, a collector-emitter current Ice starts to flow, and a collector-emitter voltage (hereinafter simply referred to as collector voltage) Vce starts to lower.

In the conventional semiconductor device, the collector voltage Vce reaches a minimum value at the point of time T7, and then becomes almost constant. On the other hand, in the semiconductor device according to the present embodiment, the collector voltage Vce reaches a minimum value at the point of time T6 before the point of time T7, and then becomes almost constant. That is, in the semiconductor device according to the present embodiment, the collector voltage Vce can be lowered to the minimum value earlier than the collector voltage Vce in the conventional semiconductor device, reducing a switching loss during a transition from the off state to the on state.

A specific principle will be described. In a semiconductor device where the second gate electrodes 15b are electrically coupled to the upper electrode 19, a portion abutting on the drift layer 11 on each of the second trenches 13b is charged during a transition from the off state to the on state, forming an inversion layer that is the p-type. As illustrated in FIGS. 3A and 4A, a depletion layer d formed between the drift layer 11 and the inversion layer expands.

After that, in the conventional semiconductor device, as illustrated in FIG. 4B to FIG. 4G, as the hole density in the drift layer 11 gradually increases, the depletion layer d reduces. As illustrated in FIG. 4G, the depletion layer d disappears around the side surface of each of the second trenches 13b at the point of time T7 in the conventional semiconductor device. However, until the depletion layer d disappears, as illustrated by an arrow A in FIG. 5, holes supplied to the drift layer 11 are pulled via the depletion layer d to the inversion layer, the holes pass through the inversion layer, and the holes are swept out toward the base layer 12. As a result, in the conventional semiconductor device, as illustrated in FIG. 2, the collector voltage Vce lowers gently around the point of time T3, extending a period until the collector voltage Vce reaches the minimum value.

On the other hand, in the present embodiment, the second gate insulating films 14b are respectively made thicker than the first gate insulating films 14a to make the second capacitance smaller than the first capacitance. As a result, in the semiconductor device according to the present embodiment, an amount of charge to be accumulated in the region abutting on each of the second trenches 13b in the drift layer 11 is reduced, compared with the conventional semiconductor device. That is, as illustrated in FIG. 3A, in the semiconductor device according to the present embodiment, expansion of the depletion layer d is suppressed, compared with FIG. 4A.

In the semiconductor device according to the present embodiment, by suppressing expansion of the depletion layer d, holes supplied to the drift layer 11 become less likely to be swept out toward the base layer 12. As a result, in the semiconductor device according to the present embodiment, as illustrated in FIGS. 3B to 3G, the depletion layer d gradually becomes smaller, similarly to the conventional semiconductor device. However, as illustrated in FIG. 3F, the depletion layer d disappears around the side surface of each of the second trenches 13b at the point of time T6. Therefore, in the semiconductor device according to the present embodiment, the collector voltage Vce can be promptly lowered to the minimum value, reducing a switching loss during a transition from the off state to the on state, compared with the conventional semiconductor device.

As described above, in the semiconductor device according to the present embodiment, the second gate insulating films 14b are respectively made thicker than the first gate insulating films 14a to make the second capacitance smaller than the first capacitance. As a result, in the semiconductor device according to the present embodiment, when the semiconductor device transitions from the off state to the on state, an inversion layer becomes less likely to be formed in each of the portions respectively abutting on the second trenches 13b in the drift layer 11, suppressing expansion of the depletion layer d. Therefore, in the semiconductor device according to the present embodiment, sweeping-out of holes supplied to the drift layer 11 via an inversion layer can be suppressed, and the collector voltage Vce can be promptly lowered to a minimum value, reducing a switching loss.

Second Embodiment

A second embodiment will be described. In the present embodiment, the second gate insulating films 14b according to the first embodiment are changed in configuration. Other components are identical in configuration to the corresponding components according to the first embodiment, and thus descriptions for the other components are omitted.

Figure 6:
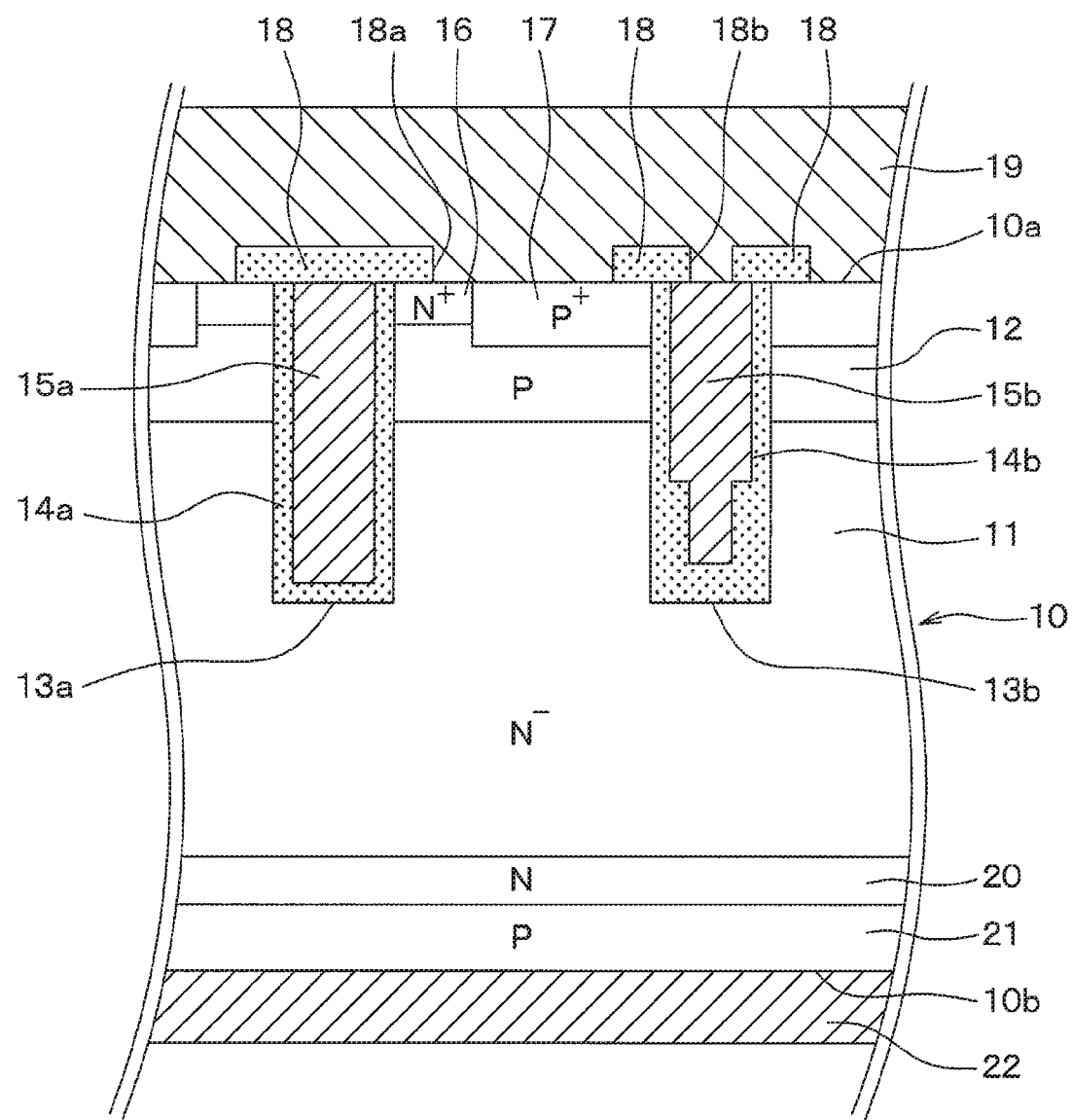
FIG. 6 is a cross-sectional view of a semiconductor device according to a second embodiment.

As illustrated in FIG. 6, in the second gate insulating films 14b according to the present embodiment, portions, which are respectively formed on regions abutting on the base layer 12, of the second trenches 13b are respectively made identical in thickness to the first gate insulating films 14a. In the second gate insulating films 14b, portions, which are respectively formed on regions abutting on the drift layer 11, of the second trenches 13b are respectively made thicker in thickness than the first gate insulating films 14a.

More specifically, in the second gate insulating films 14b, portions respectively around bottom sides of the second trenches 13b in the portions, which are respectively formed on the regions abutting on the drift layer 11, of the second trenches 13b are made thicker. In the second gate insulating films 14b, portions respectively around the base layer 12 in the portions, which are respectively formed on the regions abutting on the drift layer 11, of the second trenches 13b are respectively made identical in thickness to the first gate insulating films 14a. In other words, in the second gate electrodes 15b, portions around the base layer 12 are respectively made identical in width to the first gate electrodes 15a, whereas portions around the drift layer 11 are respectively made narrower in width than the portions respectively around the base layer 12. For the width used herein, its direction refers to a direction orthogonal to the extending direction of each of the first trenches 13a and the second trenches 13b, as well as a direction along the surface direction of the surface 10a of the semiconductor substrate 10.

That is, on the portions, which are respectively formed on the regions abutting on the drift layer 11 on the side surfaces of the second trenches 13b, of the second gate insulating films 14b according to the present embodiment, the second capacitance of each of the portions around the base layer 12 is made identical to the first capacitance. On the portions, which are respectively formed on the regions abutting on the drift layer 11 on the side surfaces of the second trenches 13b, of the second gate insulating films 14b, the second capacitance of each of the portions around the bottom sides of the second trenches 13b is made smaller than the first capacitance.

As described above, even when the second capacitance of each of the portions of the second gate insulating films 14b is made smaller than the first capacitance, whereas the second capacitance of each of the other portions is made identical to the first capacitance, the semiconductor device can suppress expansion of the depletion layer d, achieving similar effects to the effects of the first embodiment described above, Third Embodiment A third embodiment will be described. In the present embodiment, the first gate insulating films 14a according to the second embodiment are changed in configuration. Other components are identical in configuration to the corresponding components according to the second embodiment, and thus descriptions for the other components are omitted.

Figure 7:
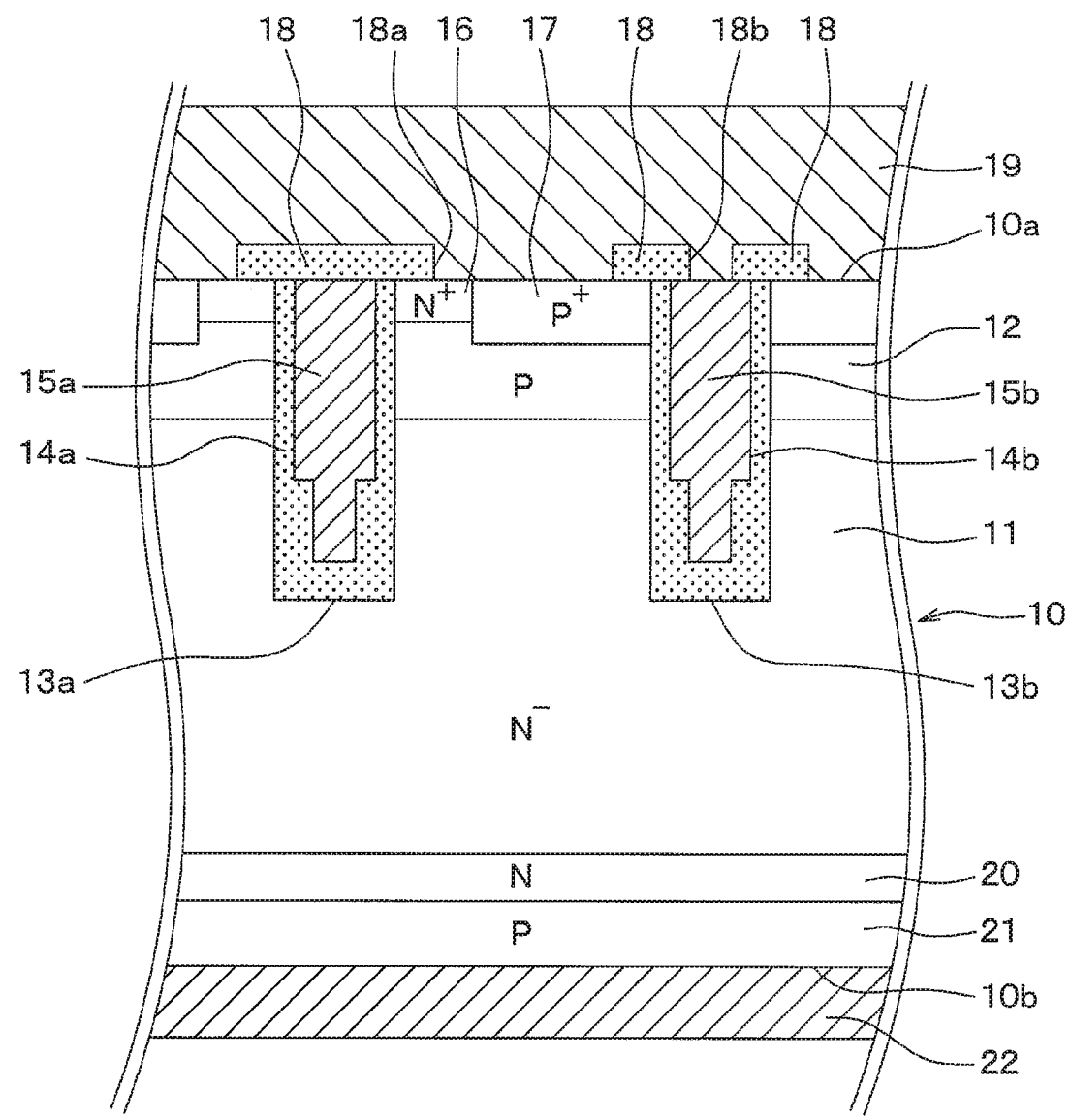
FIG. 7 is a cross-sectional view of a semiconductor device according to a third embodiment.

In the present embodiment, as illustrated in FIG. 7, the first gate insulating films 14a are respectively similar in configuration to the second gate insulating films 14b. That is, in the first gate insulating films 14a, portions, which are respectively formed on regions abutting on the drift layer 11, of the first trenches 13a are respectively made thicker in thickness than the portions formed on the regions abutting on the base layer 12. In other words, in the first gate insulating films 14a, portions respectively different from portions each determining the threshold voltage Vth are made thicker.

Even the semiconductor device described above, similar effects to the effects of the second embodiment can be achieved. In the semiconductor device, since the first gate insulating films 14a and the second gate insulating films 14b are each made similar in configuration, the first gate insulating films 14a and the second gate insulating films 14b can be formed with a similar process, simplifying a production process.

Fourth Embodiment

A fourth embodiment will be described herein. In the present embodiment, the second gate insulating films 14b according to the first embodiment are changed in configuration. Other components are identical in configuration to the corresponding components according to the first embodiment, and thus descriptions for the other components are omitted.

Figure 8:
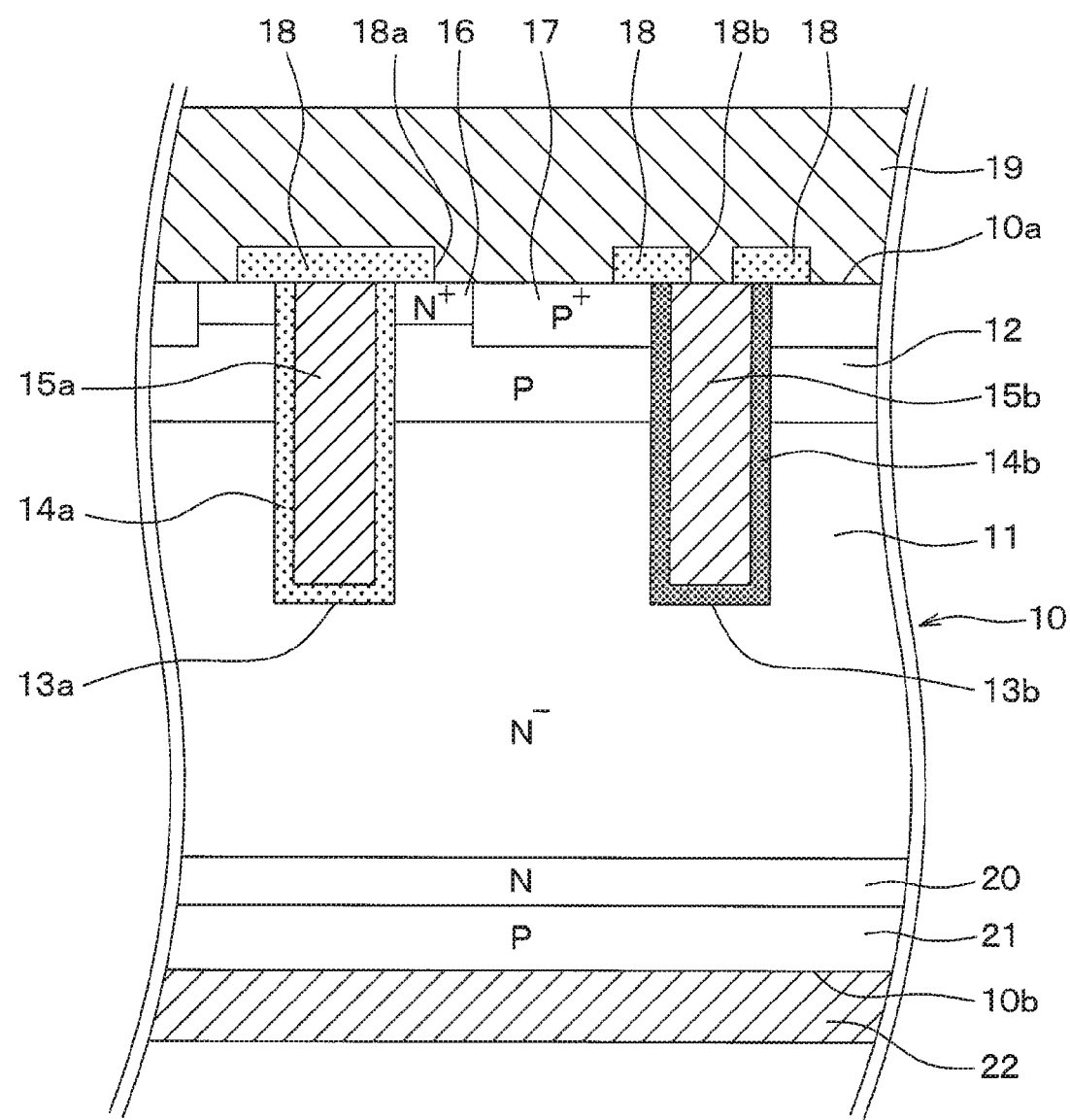
FIG. 8 is a cross-sectional view of a semiconductor device according to a fourth embodiment.

In the present embodiment, as illustrated in FIG. 8, the second gate insulating films 14b are respectively made identical in thickness to the first gate insulating films 14a. However, the second gate insulating films 14b are each made of a material smaller in dielectric constant than each of silicon oxide films forming the first gate insulating films 14a. As a result, also in the semiconductor device according to the present embodiment, the second capacitance of each of the second gate insulating films 14b is made smaller than the first capacitance of each of the first gate insulating films 14a. The material that is smaller in dielectric constant than the silicon oxide film is a fluorine added silicon oxide film (SiOF) or a carbon added silicon oxide film (SiOC), for example.

As described above, even when the second gate insulating films 14b are each made of a material smaller in dielectric constant than a material of each of the first gate insulating films 14a, the second capacitance is smaller than the first capacitance. Therefore, the semiconductor device can suppress expansion of the depletion layer d, achieving similar effects to the effects of the first embodiment described above.

Other Embodiments

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

For example, the semiconductor devices according to the embodiments have been described above based on the examples where the first conductivity type is the N-type, whereas the second conductivity type is the P-type. However, the first conductivity type may be the P-type, whereas the second conductivity type may be the N-type.

In the semiconductor devices according to the embodiments described above, the body regions 17 may not respectively abut on the second trenches 13b. That is, such a configuration may be adopted that the base layer 12 is present between each of the body regions 17 and each of the second trenches 13b. Further, in the semiconductor devices, in addition to the emitter regions 16 respectively abutting on the side surfaces of the first trenches 13a, the emitter regions 16 respectively abutting on the side surfaces of the second trenches 13b may be formed.

In the semiconductor devices according to the embodiments described above, the second gate electrodes 15b and the upper electrode 19 may not be directly electrically coupled respectively via the second contact holes 18b. For example, in the semiconductor devices, other gate pads than the gate pads respectively coupled with the first gate electrodes 15a may be provided, and the other gate pads may be electrically coupled respectively to the second gate electrodes 15b and the upper electrode 19. That is, the second gate electrodes 15b may be electrically coupled to the upper electrode 19 via the other gate pads than the gate pads coupled respectively with the first gate electrodes 15a.

In the embodiments described above, why a switching loss increases when each of the semiconductor devices transitions from the off state to the on state is that holes supplied to the drift layer 11 are swept out toward the base layer 12 via an inversion layer formed along the side surface of each of the second trenches 13b. Therefore, in the second gate insulating films 14b in the first to third embodiments described above, as long as the portions on the regions abutting on the drift layer 11 on the side surfaces of the second trenches 13b are made thicker, the portions on bottom surfaces of the second trenches 13b may not be made thicker. Similarly, in the second gate insulating films 14b in the fourth embodiment described above, the portions formed on the bottom surfaces of the second trenches 13b may be each made of a silicon oxide film.

In the second gate insulating films 14b in the second and third embodiments described above, the portions around the base layer 12 on the portions formed on the regions abutting on the drift layer 11 on the side surfaces of the second trenches 13b may be made thicker. That is, a thickness of each of the portions, which are respectively formed on the regions abutting on the drift layer 11 on the side surfaces of the second trenches 13b, of the second gate insulating films 14b only has to be made as described below. That is, the portions may be equal to or greater in thickness than the portions each determining the threshold voltage Vth on the first gate insulating films 14a, as well as at least some of the portions may each be thicker in thickness than portions each determining the threshold voltage Vth on the first gate insulating films 14a. Similarly, in the fourth embodiment described above, the portions, which are respectively formed on the regions abutting on the drift layer 11 on the side surfaces of the second trenches 13b, of the second gate insulating films 14b only have to be made as described below. That is, the portions may be equal to or lower in dielectric constant than the portions each determining the threshold voltage Vth on the first gate insulating films 14a, as well as at least some of the portions may each be lower in dielectric constant than the portions each determining the threshold voltage Vth on the first gate insulating films 14a.

In the semiconductor device according to the second embodiment described above, the width of each of the second gate electrodes 15b may be constant in a thickness direction of the semiconductor substrate 10. To achieve the configuration described above, portions around the bottom sides of the second trenches 13b may be extended longer in width than portions on opening sides, and portions, which respectively lie around the bottom sides of the second trenches 13b, of the second gate insulating films 14b may be made thicker.

Further, in the semiconductor device according to the fourth embodiment described above, as long as the second capacitance is equal to or below the first capacitance, and at least some of the second capacitances are each smaller than the first capacitance, the second gate insulating films 14b may be respectively made thinner than the first gate insulating films 14a.

The embodiments described above can be combined as required. For example, the fourth embodiment may be combined to the first to third embodiments to achieve the second gate insulating films 14b each made of a material lower in dielectric constant than a material of each of the first gate insulating films 14a.

Optional aspects of the present disclosure will be set forth in the following clauses.

According to a first aspect of the present disclosure, a semiconductor device, in which gate electrodes are provided respectively on gate insulating films, includes a drift layer, a base layer, a collector layer, the gate insulating films, the gate electrodes, an emitter region, a first electrode and a second electrode.

The drift layer has a first conductivity type. The base layer has a second conductivity type and is provided on the drift layer. The collector layer has the second conductivity type. The drift layer is provided between the base layer and the collector layer. The gate insulating films are respectively provided on wall surfaces of trenches penetrating the base layer to reach the drift layer. The gate electrodes are respectively provided on the gate insulating films. The emitter region has the first conductivity type, is provided in a surface layer portion of the base layer, and is in contact with the trenches. The first electrode is electrically coupled with the base layer and the emitter region. The second electrode is electrically coupled with the collector layer.

Some gate electrodes of the gate electrodes are applied with a gate voltage. Other gate electrodes are electrically coupled to the first electrode to have a potential equivalent to the first electrode. The trenches in which the some gate electrodes are respectively provided are referred to as first trenches. The trenches in which the other gate electrodes are respectively provided are referred to as second trenches. The gate insulating films respectively provided on wall surfaces of the first trenches are referred to as first gate insulating films. The gate insulating films respectively provided on wall surfaces of the second trenches are referred to as second gate insulating films.

A capacitance per unit area of each of portions of the second gate insulating films is referred to as a second capacitance, the portions being respectively provided on regions in contact with the drift layer on side surfaces of the second trenches. A capacitance per unit area of each of portions of the first gate insulating films is referred to as a first capacitance, the portions being respectively provided on regions in contact with the base layer on side surfaces of the first trenches.

All of the second capacitances are each equal to or less than the first capacitances, and at least some of the second capacitances are each less than the first capacitances. All the portions of the second gate insulating films are each equal to or greater in thickness than the portions of the first gate insulating films, and the second gate insulating films are each equal in configuration to the first gate insulating films.

According to a second aspect of the present disclosure, a semiconductor device includes a drift layer, a base layer, a collector layer, a plurality of gate insulating films, a plurality of gate electrodes, an emitter region, an emitter electrode and a collector electrode.

The drift layer has a first conductivity type. The base layer has a second conductivity type and is provided on the drift layer. The collector layer has the second conductivity type. The drift layer is provided between the base layer and the collector layer. The plurality of gate insulating films is respectively provided on wall surfaces of trenches penetrating the base layer to reach the drift layer. The plurality of gate electrodes is respectively provided on the plurality of gate insulating films. The emitter region has the first conductivity type, is provided in a surface layer portion of the base layer, and is in contact with the trenches. The emitter electrode is electrically coupled with the base layer and the emitter region. The collector electrode is electrically coupled with the collector layer.

The plurality of gate electrodes includes a first gate electrode applied with a gate voltage. The first gate electrode is provided in a first trench included in the trenches. The plurality of gate electrodes further includes a second gate electrode electrically coupled to the emitter electrode to have a potential equivalent to the emitter electrode. The second gate electrode is provided in a second trench included in the trenches. The plurality of gate insulating films includes a first gate insulating film provided on a wall surface of the first trench. The plurality of gate insulating films further include a second gate insulating film provided on a wall surface of the second trench.

A capacitance per unit area of each of portions of the second gate insulating film is referred to as a second capacitance, the portions being respectively provided on regions in contact with the drift layer on a side surface of the second trench. A capacitance per unit area of each of portions of the first gate insulating films is referred to as a first capacitance, the portions being respectively provided on regions in contact with the base layer on a side surface of the first trench.

All of the second capacitances are each equal to or less than the first capacitances, and at least some of the second capacitances are each less than the first capacitances. All the portions of the second gate insulating film are each equal to or greater in thickness than the portions of the first gate insulating film. The second gate insulating film is equal in configuration to the first gate insulating film.

With the semiconductor device according to the present disclosure, an inversion layer is less likely to be formed in a portion abutting on a second trench in the drift layer during a transition from the off state to the on state, suppressing expansion of a depletion layer. Therefore, in the semiconductor device described above, sweeping-out of carriers (e.g., holes) supplied to the drift layer via the inversion layer can be suppressed. As a result, with the semiconductor device described above, a collector-emitter voltage can be promptly lowered to a minimum value, reducing a switching loss.

What is claimed is:
1. A semiconductor device in which gate electrodes are provided respectively on gate insulating films, the semiconductor device comprising:
   a drift layer having a first conductivity type;
   a base layer having a second conductivity type and provided on the drift layer;
   a collector layer having the second conductivity type, the drift layer being provided between the base layer and the collector layer;
   the gate insulating films respectively provided on wall surfaces of trenches penetrating the base layer to reach the drift layer;
   the gate electrodes respectively provided on the gate insulating films;
   an emitter region having the first conductivity type, provided in a surface layer portion of the base layer, and being in contact with the trenches;
   a first electrode electrically coupled with the base layer and the emitter region; and
   a second electrode electrically coupled with the collector layer, wherein
   some gate electrodes of the gate electrodes are applied with a gate voltage, and other gate electrodes are electrically coupled to the first electrode to have a potential equivalent to the first electrode,
   the trenches in which the some gate electrodes are respectively provided are referred to as first trenches,
   the trenches in which the other gate electrodes are respectively provided are referred to as second trenches,
   the gate insulating films respectively provided on wall surfaces of he first trenches are referred to as first gate insulating films,
   the gate insulating films respectively provided on wall surfaces of the second trenches are referred to as second gate insulating films,
   a capacitance per unit area of each of portions of the second gate insulating films is referred to as a second capacitance, the portions being respectively provided on regions in contact with the drift layer on side surfaces of the second trenches,
   a capacitance per unit area of each of portions of the first gate insulating films is referred to as a first capacitance, the portions being respectively provided on regions in contact with the base layer on side surfaces of the first trenches,
   all of the second capacitances are each equal to or less than the first capacitances, and at least some of the second capacitances are each less than the first capacitances, all the portions of the second gate insulating films are each equal to or greater in thickness than the portions of the first gate insulating films, and the second gate insulating films are each equal in configuration to the first gate insulating films.

2. The semiconductor device according to claim 1, wherein all the portions of the second gate insulating films are each equal to or less in dielectric constant than the portions of the first gate insulating films.

3. A semiconductor device comprising:

a drift layer having a first conductivity type;

a base layer having a second conductivity type and provided on the drift layer;

a collector layer having the second conductivity type, the drift layer being provided between the base layer and the collector layer;

a plurality of gate insulating films respectively provided on wall surfaces of trenches penetrating the base layer to reach the drift layer;

a plurality of gate electrodes respectively provided on the plurality of gate insulating films;

an emitter region having the first conductivity type, provided in a surface layer portion of the base layer, and being in contact with the trenches;

an emitter electrode electrically coupled with the base layer and the emitter region; and a collector electrode electrically coupled with the collector layer, wherein the plurality of gate electrodes include a first gate electrode applied with a gate voltage, the first gate electrode is provided in a first trench included in the trenches, the plurality of gate electrodes further include a second gate electrode electrically coupled to the emitter electrode to have a potential equivalent to the emitter electrode, the second gate electrode is provided in a second trench included in the trenches, the plurality of gate insulating films include a first gate insulating film provided on a wall surface of the first trench, the plurality of gate insulating films further include a second gate insulating film provided on a wall surface of the second trench, a capacitance per unit area of each of portions of the second gate insulating film is referred to as a second capacitance, the portions being respectively provided on regions in contact with the drift layer on a side surface of the second trench, a capacitance per unit area of each of portions of the first gate insulating films is referred to as a first capacitance, the portions being respectively provided on regions in contact with the base layer on a side surface of the first trench, all of the second capacitances are each equal to or less than the first capacitances, and at least some of the second capacitances are each less than the first capacitances, all the portions of the second gate insulating film are each equal to or greater in thickness than the portions of the first gate insulating film, and the second gate insulating film is equal in configuration to the first gate insulating film.

* * * * *